United States Patent [19]

Munday et al.

[11] Patent Number: 4,977,368

[45] Date of Patent: Dec. 11, 1990

[54] ELECTRIC UTILITY METER WITH ELECTRONIC REGISTER

[75] Inventors: Mark L. Munday; William P. Doby, both of Raleigh; Robert A. Loose, Cary, all of N.C.

[73] Assignee: ABB Power T&D Company, Blue Bell, Pa.

[21] Appl. No.: 186,425

[22] Filed: Apr. 26, 1988

[51] Int. Cl.$^5$ ............................................. G01R 11/02
[52] U.S. Cl. .................................... 324/142; 324/157
[58] Field of Search ................. 324/142, 157, 103 R, 324/116, 127; 364/483, 707; 307/66, 296.3, 296.4, 442

[56] References Cited

U.S. PATENT DOCUMENTS

| | | | |
|---|---|---|---|
| 4,591,782 | 5/1986 | Germer | 324/103 R |
| 4,677,311 | 6/1987 | Morita | 307/66 |
| 4,783,623 | 11/1988 | Edwards et al. | 324/157 |
| 4,791,367 | 12/1988 | Philpot | 324/157 |

Primary Examiner—Reinhard J. Eisenzopf
Assistant Examiner—Edward Urban
Attorney, Agent, or Firm—A. J. Rossi

[57] ABSTRACT

An electric utility meter composed of: a chassis assembly (2) having elements (4) for connecting the meter between a source of electrical power and a consumer of the electrical power; a signal generating unit (30) carried by the chassis assembly (2) and electrically coupled to the elements (4) for connecting for providing a signal which is a function of the energy being supplied to the consumer, the signal generating unit including a first electrical connector (34) to which the signal is supplied; a front plate member (16,20) carried by the chassis assembly (2) and bearing legible information (48) identifying the meter; circuitry (100) for deriving information relating to the rate at which energy is being supplied to the consumer; an electrical signal conductor (72) connected to the circuitry (100) and having a second electrical connector (70) coupled to the first electrical connector (34) for supplying the signal to the circuitry (100); and an electrically actuated numeric display device (81) electrically connected to the circuitry (100) for displaying the information derived by the circuitry (100), wherein the circuitry (100), the electrical signal conductor (72), and the display device (81) form a plug-in module which is removably inserted into the chassis assembly (2) behind the plate member so that the legible information is not obscured by the module, and the first and second electrical connectors (34,70) are disposed to become coupled together as a result of insertion of the module into the chassis assembly (2).

11 Claims, 3 Drawing Sheets

ELECTRIC UTILITY METER WITH ELECTRONIC REGISTER

BACKGROUND OF THE INVENTION

The present invention relates to electric utility meters, and in particular meters having, or capable of receiving, electronic registers for performing advanced metering functions.

Traditional electric utility meters are electromechanical devices which derive information relating to the energy being supplied from a utility to a consumer and produce, by means of rotating pointers, an indication of the total energy consumed.

In recent years, there has been a demand for meters capable of performing advanced functions such as the recording of peak demand information, time of use information indicating energy consumption during specified time periods, and load profile information.

Generation of such information is best achieved with electronic circuitry which places the desired information in a readable form on a numeric display, i.e. a display such as a liquid crystal display (LCD) which displays at least numerals and possibly but not necessarily characters. It has already been proposed to provide a record of peak demand and time of use information by adding an electronic register to a standard meter. Electronic registers of this type are presently being offered by the Westinghouse Electric Corporation and the General Electric Company, for example.

However, the electronic registers which have already been proposed suffer from the drawback that they must be installed in such a manner that they obscure the meter name plate information provided on the standard meter, which information should be readily accessible to a meter reader.

In addition, the electronic registers which have been proposed cannot be easily installed into a meter, or removed therefrom, in the field since the electrical connection of such registers to the meter is a difficult operation.

Furthermore, the registers which have already been proposed cannot be constructed &:o perform advanced functions while still being insertable into standard chassis.

SUMMARY OF THE INVENTION

It is an object of the present invention to equip an electric utility meter with an electronic register which can be installed and removed easily in the field.

Another object of the invention is to provide an electronic register which can be inserted into a meter and which will, during installation, automatically establish the requisite electrical connections with the circuitry which is permanently installed in the meter.

Another object of the invention is to provide an electronic register which can be inserted into a meter without obscuring the existing meter name plate information.

Yet another object of the invention is to permit a variety of electronic registers capable of performing different functions to be interchangeably installed in a meter without requiring modification, or significant modification, of the meter.

The above and other objects are achieved, according to the present invention, by an electric utility meter comprising: a chassis assembly having means for connecting the meter between a source of electrical power and a consumer of the electrical power; signal generating means carried by the chassis assembly and electrically coupled to the means for connecting for providing a signal which is a function of the energy being supplied to the consumer, the signal generating means including a first electrical connector to which the signal is supplied; a front plate member carried by the chassis assembly and bearing legible information identifying the meter; circuit means for deriving information relating to the rate at which energy is being supplied to the consumer; electrical signal conductor means connected to the circuit means and having a second electrical connector coupled to the first electrical connector for supplying the signal to the circuit means; and an electrically actuated numeric display device electrically connected to the circuit means for displaying the information derived by the circuit means, wherein the circuit means, the electrical signal conductor means, and the display device form a plug-in module which is removably inserted into the chassis behind the plate member so that the legible information is not obscured by the module, and the first and second electrical connectors are disposed to become coupled together as a result of insertion of the module into the chassis.

The structure according to the present invention enables any selected one of a variety of register types to be interchangeably installed in a meter, in the field, accompanied by the automatic establishment of electrical connections between the register and circuitry mounted in the meter, without obscuring the meter name plate.

Moreover, the invention allows for future development of advanced information processing functions without requiring modification of the meter itself.

DESCRIPTION OF THE PREFERRED EMBODIMENTS

Figure 1:
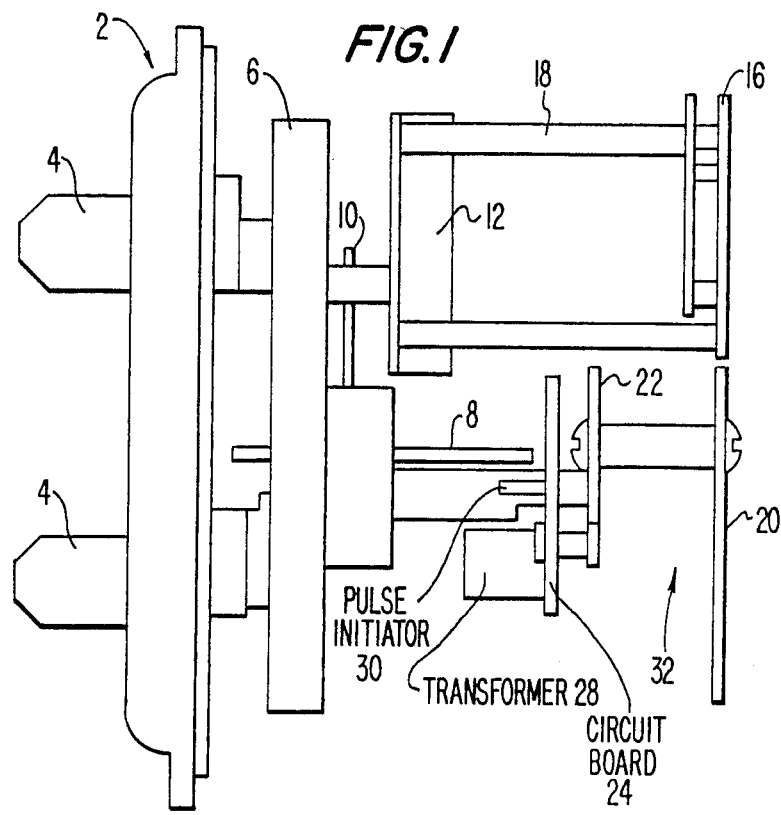
FIG. 1 is a side elevational view of a utility meter constructed according to one preferred embodiment of the invention.

The basic structure of a utility meter according to the present invention is shown in FIG. 1. This structure includes a chassis assembly 2 carrying connector blades 4 via which the meter is connected in series between utility power lines and a consumer of electrical energy, such as a building or apartment. For single phase service, two pairs of blades 4 will be provided, while for polyphase service, a larger number of blade pairs will be provided.

Blades 4 are electrically connected to a voltage element and a current element, supported by a holder 6, which produce magnetic fields that act to rotate a drive disk 8 which rotates at a rate proportional to the rate at which power is being supplied to the consumer, so that the total rotation of disk 8 is representative of total energy consumption. The voltage and current elements and drive disk 8 are constructed in a manner which is conventional in the art, so that these elements will not be described or illustrated in greater detail.

In a manner which is also conventional in the art, disk 8 has a shaft 10 which is coupled to drive a gear mechanism (not shown) disposed in a holder 12. Here, the gear mechanism, in turn, drives a set of mechanical pointers associated with dials on the front of a dial plate 16 which is supported from holder 12 by suitable bolts and standoffs 18. The gear mechanism is coupled to the pointers by a suitable pointer shaft. This represents the conventional manner in which energy consumption is recorded for periodic reading by a meter reader.

The conventional components of the meter are completed by a name plate 20 which is supported from holder 6 via an intermediate support plate 22. As is customary, name plate 20 bears legible information identifying the meter, this identifying information including the meter type and serial number.

In a complete meter, the components illustrated in FIG. 1 will be enclosed by a cover assembly including a glass or plastic cover member and components for locking the cover member to chassis assembly 2 and for preventing meter tampering. All of this structure is also conventional in the art.

In order to permit the meter according to the present invention to process power consumption information electronically, the meter is further provided with a printed circuit board 24 carrying, inter alia, a transformer 28 and a pulse initiator head 30.

Transformer 28 receives its primary voltage from the mains voltage existing between a pair of the blades 4 and converts this to a secondary voltage, for example of the order of 13 VRMS, which is available on circuit board 24. Thus, separate connections need not be provided for supplying operating voltage to transformer 28.

Pulse initiator head 30 is constructed and disposed to cooperate with detectable markings on disk 8 in order to provide data signals indicative of the rate of rotation of disk 8, and thus the rate at which power is being supplied to the consumer As an example, disk 8 could be provided, on its lower surface, with a series of reflecting and nonreflecting regions which are detected by one or two LED-light sensor pairs mounted in head 30. The signals derived by head 30 are available within the circuitry on board 24.

Transformer board 24 is provided with circuitry for decoding the pulses generated by head 30 to produce energy consumption data signals and with circuitry for performing the requisite surge suppression functions. Thus, the circuitry on board 24, which is permanently installed in meter 2, provides a constant interface with head 30 so that meter 2, with permanently installed transformer board 24, can be qualified to be placed into service independently of the electronic register.

The meter is constructed to receive an electronic register module which can derive and display various types of information relating to energy consumption, such as peak demand and time of use data, from the data provided by the decoding circuitry on board 24. According to the invention, such a module will be inserted into the region 32 provided between name plate 20 and circuit board 24. When the module is inserted, an edge card receptacle on the module will mate with edge card fingers provided on board 24.

Figure 2:
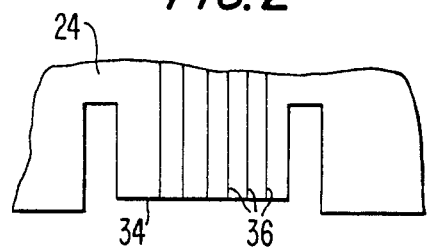
FIG. 2 is a detailed view of a portion of one component of the structure of FIG. 1.

A portion of the lower edge of circuit board 24 is shown in FIG. 2. This portion includes an edge connector part 34 having a plurality of surface edge card fingers 36 at which the various signals mentioned above are available.

Thus, contact fingers 36, forming a male connector, are rigidly supported on board 24 so that their positions relative to one another cannot change.

Figure 3:
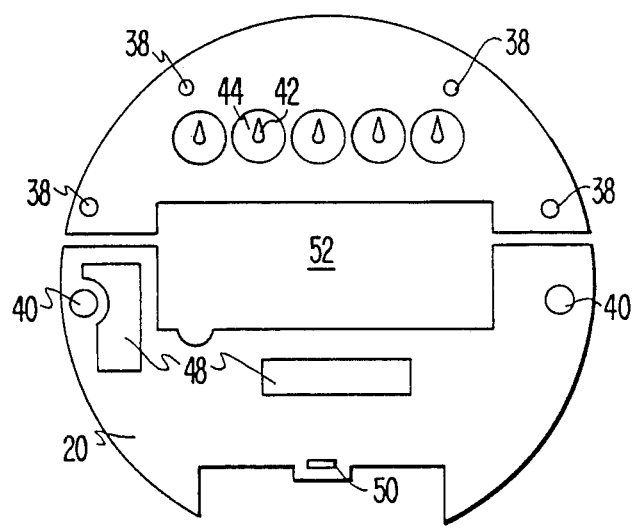
FIG. 3 is a front elevational view of the dial plate and name plate of the meter shown in FIG. 2.

FIG. 3 is a front elevational view showing the appearance of dial plate 16 and name plate 20. Plate 16 is supported by holder 12 via bolts disposed at locations 38, while name plate 20 is supported by plate 22 by bolts disposed at locations 40. Dial plate 16 supports pointers 42 associated with dials 44.

Name plate 20 is provided with the identifying information mentioned above at, for example, locations 48, as well as with a latching recess 50, the function of which will be described below.

Plates 16 and 20 are further formed to present a rectangular opening 52 for a numeric display associated with the electronic register module.

Figure 4:
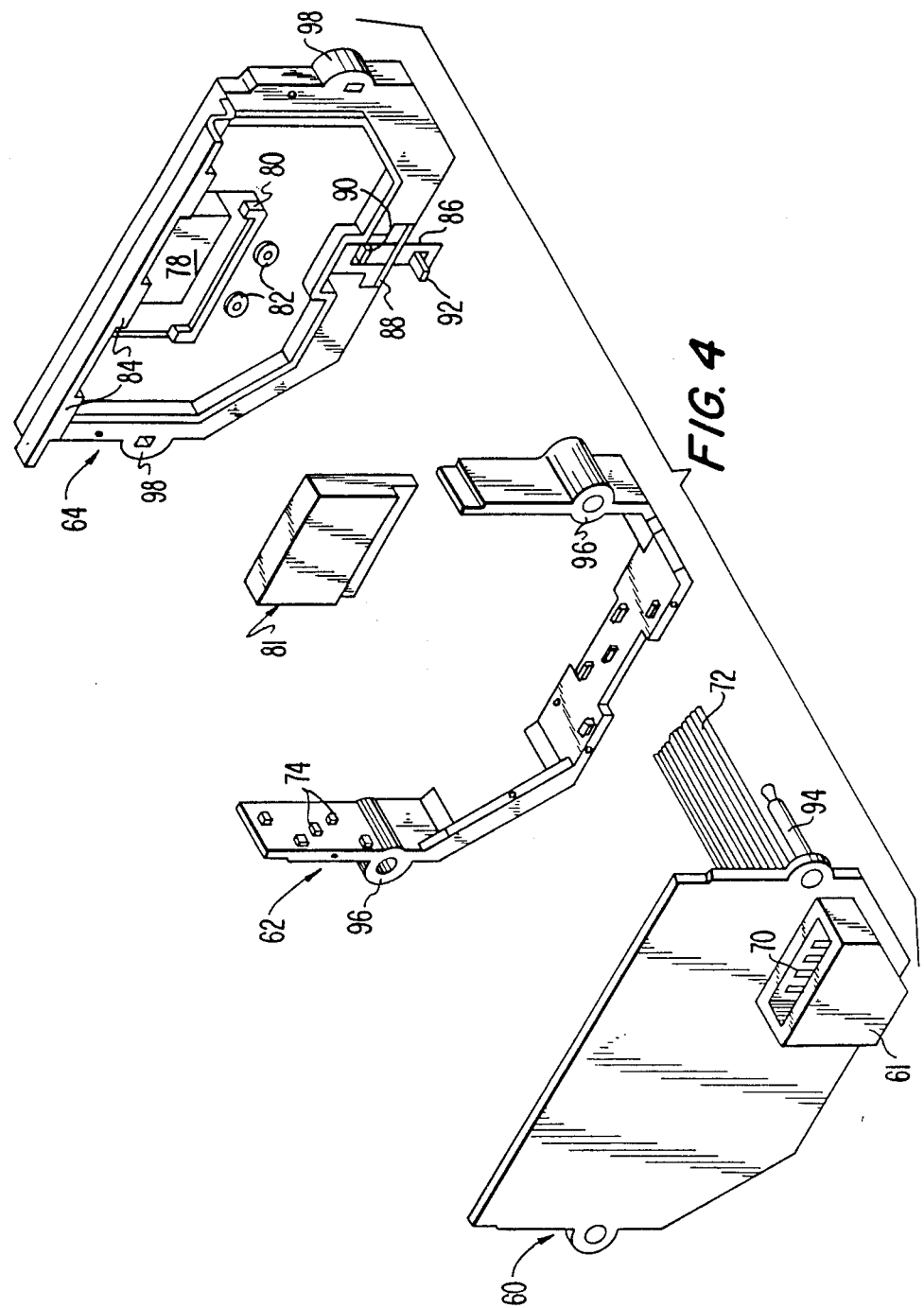
FIG. 4 is an exploded, perspective view of the housing parts of an electronic register module which forms part of the meter shown in FIG. 1.

One embodiment of the housing for an electronic register module which can be employed in the meter of FIG. 1 is shown in FIG. 4. This module includes a back cover assembly 60, a card holder 62 and a front cover assembly, or bezel, 64.

The rear surface of back cover assembly 60 is provided with a receptacle holder 68 containing an edge card receptacle 70 positioned to automatically mate with fingers 36 of board 24 when the module is inserted into space 32 of the meter shown in FIG. 1. The connectors of receptacle 70 are permanently connected to a flat cable 72, which may be a 16-lead cable.

The other end of cable 72 is provided with a suitable connector (not shown) for connection to a printed circuit board, or card, (not shown) mounted in card holder 62. In the simplest embodiment of a module according to the present invention, the printed circuit board installed in card holder 62 serves, as one of its functions, to provide output signals to a display device mounted in front cover assembly 64. Therefore, this card is generally termed a display card and this terminology will be employed herein.

In order to hold the display card in position, the interior surfaces of card holder 62 are provided with suitable positioning bosses 74. As can be seen in FIG. 4, several rows of bosses are provided to allow for different card positions.

The display card is a printed circuit board which carries a circuit constructed to derive from the data signals generated on board 24 information relating to the energy consumption being metered, this information typically including demand, time of use and/or load profile metering data. All of these functions can be accomplished using a single printed circuit board, or card, and circuitry for performing these functions is already known in the art.

Cable 72 can be connected to the display card in any suitable manner. According to one example, the display card can be provided with a pin header which mates with a pin receptacle connected to the end of cable 72. However, other connection arrangements are equally possible.

Front cover assembly 64 is provided with a display opening 78 surrounded by a holding receptacle including a ledge 80 for receiving and supporting a flat LCD display element 81 of a conventional type. This display element can be provided with input connectors along its lower edge, adjacent ledge 80, for connection to output contacts suitably located on the side of the display card facing the display element.

Connection between the display card and the display element could be effected by means of an elastomeric conductive strip supported on ledge 80 and compressed between the input conductors on the display element and the output conductors on the display card. Such a connection arrangement is described in a copending application filed concurrently with the present application and disclosing an invention by Mark L. Munday and William P. Doby, the application being entitled CONTACT STRUCTURE EMPLOYING AN ELASTOMERIC CONNECTOR.

For holding the display card against the conductive strip, front cover assembly 64, which is a one-piece member, is provided with two threaded bosses 82 against which the display card is held t,y suitable threaded connectors extending through openings provided in the display card and fixed in the threaded passages of bosses 82.

To provide further support for the display card, front cover 64 is provided along its upper edge with a series of retaining lips defining a channel for retaining the upper edge of the display card.

For latching the display module into the space 32 provided in the meter, front cover 64 is further provided with an integrally molded latch element 86 which is fixed to a twistable pivot bar 88. Latch element 86 includes a latch member 90 and a protruding member 92. Latch member 90 cooperates with latching recess 50 of name plate 20 in a manner which will be described below.

In order to assemble an electronic register module composed of the components shown in FIG. 4, a display card is slipped into place in card holder 62. LCD 81 and an elastomeric conductive strip are then placed on ledge 80 and card holder 62 is assembled to front cover 64 in such a manner that the upper edge of the display card is introduced into the channel behind retaining lips 84. The display card is then secured to bosses 82 by suitable threaded connectors, after which cable 72 is electrically connected to the card and back cover assembly 60 is assembled to the other parts by inserting two pins 94 carried by assembly 60 through passages 96 in card holder 62 and into passages 98 provided in front cover 64. The free end of each pin 94 is notched to engage a bayonet receptacle provided in each passage 98. This provides a sufficiently secured coupling between all of the register module parts.

The assembled module can then be inserted into the meter shown in FIG. 1 by simply sliding it into space 32 from below. During this insertion movement, edge card receptacle 70 automatically mates with fingers 36 and latch member 90 automatically engages latching recess 50.

The spacing between name plate 20 and support plate 22 is selected to conform closely to the distance between the front surface of front cover 64 and the rear surface of back cover assembly 70. Support plate 22 is provided with a recess permitting passage of receptacle holder 68. The close fit thus provided, together with the retaining action of latch element 86 and the connecting force between fingers 36 and receptacle 70 are sufficient to securely hold the electronic register model in place in the meter. In addition, the latch arrangement provides a shakeproof connection in that during any rearward movement of the electronic register module, latch 90 tends to be pushed further into recess 50 and there is an increase in the force with which latch element 86 engages latching recess 50, while during any forward movement of the electronic register module, latch member 90 will continue to be pressed into recess 50.

If, in order to permit advanced functions to be performed, more than one circuit board is to be incorporated into the electronic register module, a plurality of identical card holders 62 can be provided adjacent one another, or the single card holder 62 can be dimensioned to hold a plurality of cards. In either of these cases, cable 72 would be provided with the appropriate number of connectors, each arranged to be connected to a respective card, so that all of the lines of cable 72 are connected as a bus to all of the cards in parallel. In addition, each of the pins 94 can be replaced by an appropriate longer pin.

If the meter shown in FIG. 1 must be modified to receive a module containing a larger number of cards, this can be easily accomplished by providing longer connecting standoffs for plates 16 and 20, together with a longer pointer shaft and shaft guard for the first dial pointer associated with plate 16.

In all embodiments of the present invention, an electronic register module can be easily installed and removed as needed with assurance that the information contained on name plate 20 will always be readily visible.

When the electronic register module according to the present invention is installed in the meter shown in FIG. 1, display opening 78 is aligned with the rectangular opening 52 defined by plates 16 and 20, so that the display provided by the LCD element 81 in the electronic register module will be easily readable without obscuring dials 44.

Figure 5:
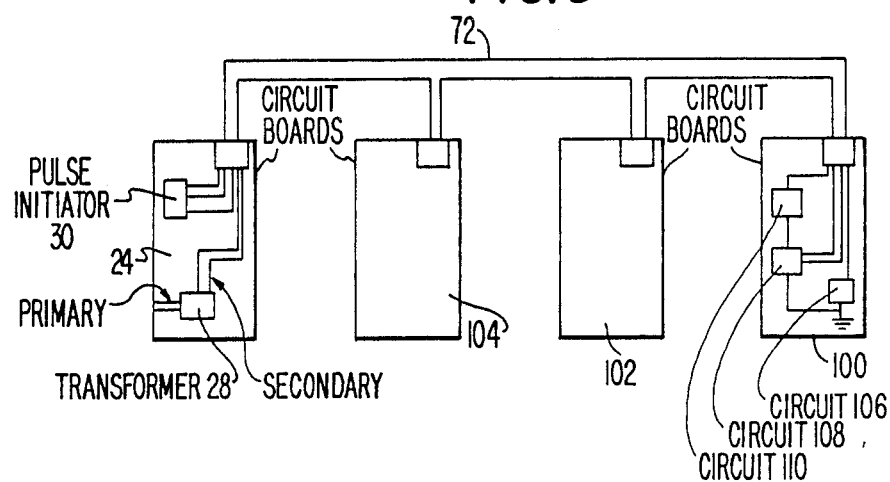
FIG. 5 is a diagram illustrating the connections between various printed circuit boards in a meter according to the present invention.

A further aspect of the invention resides in the manner in which the various circuit boards are interconnected and the manner in which signals are generated and distributed. Specifically, cable 72 is connected among the boards in the form of a bus such that each line of the cable is connected to all boards in parallel, as shown in FIG. 5, where board 100 is the display board and boards 102 and 104 are additional boards provided to perform more advanced functions. According to a preferred scheme, the mains voltage supplied to transformer 28 on transformer board 24 is converted by transformer 28 into a 13 VRMS power supply voltage which is delivered via two lines of cable 72 to each of the other boards 100, 102 and 104. This voltage is utilized by circuitry provided on board 100 to generate a 5-6 VDC regulated supply voltage and a 17 VDC unregulated supply voltage, each of which is supplied via a respective line of cable 72 to the other boards. The regulated supply voltage can be generated from the unregulated supply voltage. The regulated supply voltage generated on board 10° is used on board 24 to power pulse initiator head 30. The regulated voltage generated by the circuitry on board 100 is supplied to all logic circuits in the meter, so that they are all at the same logic level.

A rectifier circuit 106 on board 100 further creates a memory/logic ground which is normally applied via a switching circuit 108 to two separate lines of cable 72. A further circuit unit on board 100 generates a 60 Hz time base signal from the AC voltage supplied via board 24, while a further circuit 110 on board 100 generates, from that AC signal, a power failure detection signal which is applied to switching circuit 108 to disconnect one of the output lines thereof from ground. This output line constitutes the ground connector for all circuits which need not operate in the event of a power failure. In that case, the circuits connected to that ground are deactivated and do not draw current. This enables the emergency power supply provided in the meter, which may be in the form of a large capacitor or battery, to continue to run the essential data storage circuitry for a longer period of time.

The circuitry which is permanently connected to ground can be of the type which stores essential information in nonvolatile memory on the occurrence of a power failure.

The provision of a switchable ground eliminates the need for otherwise isolating the components which need not function in the event of a power failure.

A further line of cable 72 provides the data signal generated on board 24 relating to the energy being supplied to the consumer. An additional line provided in cable 72 provides a data signal representing the energy being supplied by the consumer to the utility in the event the consumer is acting as a power generator. This could occur if the consumer were equipped with a solar or wind generator which is producing more energy than is being consumed at that location. In this case, the direction of rotation of disk 8 would be reversed.

Finally, cable 72 is provided with five lines permitting communication between module boards in connection with the performance with advanced functions.

The invention can further be adapted to a totally electronic meter in which all electromechanical components are eliminated and replaced by a purely electronic circuit, permanently installed in the meter, which derives energy consumption information directly from the voltage and current levels of the power being supplied to the consumer. In this case, the energy consumption data generated by circuitry permanently installed in the meter would be supplied via cable 72 to the one or more circuit cards of the electronic register module. The bus structure provided by cable 72 offers the advantage that it is compatible with a totally electronic meter.

Additional boards 102 and 104 can be provided with circuitry which operates to provide additional information such as indications of demand interval or a pulse repeat output which indicates the manner in which disk 8 is rotated. In addition, one of the additional boards can be provided with circuitry and external connector constituting a facility permitting a communication with a computer, if necessary via a modem.

What is claimed:

1. An electric utility meter comprising: a chassis assembly having means for connecting said meter between a source of electrical power and a consume of the electrical power; a first circuit board permanently installed in said chassis assembly and carrying signal generating means electrically coupled to said means for connecting for providing a signal which is a function of the energy being supplied to the consumer, said first circuit board including a first electrical connector to which the signal is supplied; transformer means mounted on said first circuit board and having a primary connected to said means for connecting in order to receive the voltage from the electrical power source, said transformer means having a secondary connected to said first electrical connector; a front plate member carried by said chassis assembly and bearing legible information identifying the meter; circuit mean for deriving information relating to the rate at which energy is being supplied to the consumer; electrical signal conductor means connected to said circuit means and having a second electrical connector coupled to said first electrical connector for supplying the signal to said circuit means; and an electrically actuated numeric display device electrically connected to said circuit means for displaying the information derived by said circuit means, wherein said circuit means, said electrical signal conductor means, and said display device form a plug-in module which is removable inserted into said chassis assembly behind said plate member so that the legible information is not obscured by said module, and said first and second electrical connectors are disposed to become coupled together as a result of insertion of said module into said chassis assembly.

2. A meter a defined in claim 1 wherein said first electrical connector comprises edge finger contacts on said circuit board.

3. A meter as defined in claim 3 wherein said second electrical connector is a finger contact receptacle oriented and positioned to mate with said first electrical connector during insertion of said module into said chassis assembly.

4. A meter as defined in claim 1 further comprising a second printed circuit board carrying said circuit means, and wherein said circuit means comprise circuits for producing signals containing information relating to the supply of power to the consumer as a function of time.

5. A meter as defined in claim 4 wherein said electrical signal conductor means comprise a flexible multiconductor cable connected between said second electrical connector and said second printed circuit board.

6. A meter as defined in claim 5 additionally comprising a further printed circuit board forming part of said module and connected to said cable, said cable being connected to said second printed circuit board and to said further printed circuit board in a manner such that said cable constitutes a connecting bus.

7. A meter as defined in claim 6 wherein said transformer means has a secondary connected to said cable for supplying a secondary voltage to said second printed circuit board, and said circuit means comprise a voltage generating circuit connected for generating a regulated supply voltage from the secondary voltage and for supplying the regulated supply voltage to said cable.

8. A meter as defined in claim 5 wherein said transformer means secondary is connected to said cable for supplying a secondary voltage to said second printed circuit board, and said circuit means comprise a voltage generating circuit connected for generating a regulated supply voltage from the secondary voltage and for supplying the regulated supply voltage to said cable.

9. A meter as defined in claim 4 further comprising an emergency power source for supplying operating power in the event of failure of the source of electrical power, and wherein said circuit means comprise: a first circuit connected for generating a power failure signal when the source of electrical power experiences a power failure; means defining a ground point of said circuit means; a second circuit which is to continue operating in the event of a power failure and a third circuit which is to cease operating in the event of a power failure in order to conserve emergency power, each of said second and third circuits having a ground connection, being connected to receive operating power from said emergency power source, and being operable as long as its ground connection is connected to said ground point; and means normally connecting said ground connections to said ground point and connected to said first circuit for disconnecting said ground connection of said third circuit from said ground point when a power failure signal is generated.

10. A meter as defined in claim 1 wherein said numeric display device is a flat LCD and said front plate member has an opening in which said LCD is located when said module is inserted into said chassis assembly.

11. A meter as defined in claim 1 comprising latch means associated with said module for latching said module in place in said chassis assembly.

* * * * *